United States Patent
Wu et al.

(10) Patent No.: US 6,230,068 B1
(45) Date of Patent: May 8, 2001

(54) VISUALIZING METHODS FOR DISPATCH AND DIAGNOSIS OF FINITE MACHINES FOR SEMICONDUCTOR'S MANUFACTURING

(75) Inventors: Hsueh-Cheng Wu, Hsinchu; Li-Ren Lin, Chu Pei; Yuh-Dean Tsay, Ping Tung, all of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/063,951

(22) Filed: Apr. 21, 1998

(51) Int. Cl.[7] ........................ G06F 19/00
(52) U.S. Cl. ............... 700/121; 700/95; 700/900; 700/100; 700/102; 700/117; 379/10; 379/14; 379/15; 379/34; 438/149; 438/166; 438/486; 438/693
(58) Field of Search ................... 700/121, 117, 700/95, 102, 100, 99; 435/6, 177, 287.9; 379/10, 14, 15, 34; 438/149, 166, 486, 693

(56) References Cited

U.S. PATENT DOCUMENTS

| | | | | |
|---|---|---|---|---|
| 5,502,645 | * | 3/1996 | Guerra et al. | 716/18 |
| 5,544,350 | * | 8/1996 | Hung et al. | 395/500 |
| 5,550,634 | * | 8/1996 | Nakamura | 356/401 |
| 5,587,914 | * | 12/1996 | Conradson et al. | 700/94 |
| 5,630,070 | * | 5/1997 | Dietrich et al. | 705/8 |
| 5,818,716 | * | 10/1998 | Chin et al. | 700/100 |
| 5,826,238 | * | 10/1998 | Chen et al. | 705/8 |
| 5,841,677 | * | 11/1998 | Yang et al. | 364/569 |
| 5,857,258 | * | 1/1999 | Penzes et al. | 29/846 |
| 5,880,960 | * | 3/1999 | Lin et al. | 700/90 |
| 5,946,212 | * | 8/1999 | Bermon et al. | 700/97 |
| 6,025,252 | * | 2/2000 | Shindo et al. | 438/509 |

* cited by examiner

*Primary Examiner*—Ayaz R. Sheikh
*Assistant Examiner*—Frantz Blauchard Jean
(74) *Attorney, Agent, or Firm*—Christensen O'Connor Johnson Kindness PLLC

(57) ABSTRACT

A visualizing method for the working condition of the semiconductor's manufacturing machines is disclosed. Firstly, the datas of different stages in a processing line are collected from the key-stage report of the processing line. The datas are "MAIN", "MRUN", "AFTER" and "PRE", meaning the working condition of the stage. Every stage has a group of data. Specified stage-pairs in the processing line are determined. These pairs are photolithography and etching, photolithography and implanting and others. The data of each stage-pair is sequentially put in a bar chart. Then the pairs are sequentially arranged in the order of the processing line. One pair has a supplied stage and a requested stage. From the bar chart, supervisors of the processing line know the condition and the priority of every pair, and the relationship between the supplied stage and requested stage. According to the visual presentation, the supervisors can easily make decisions of the allocation of the tools in the processing line.

17 Claims, 4 Drawing Sheets

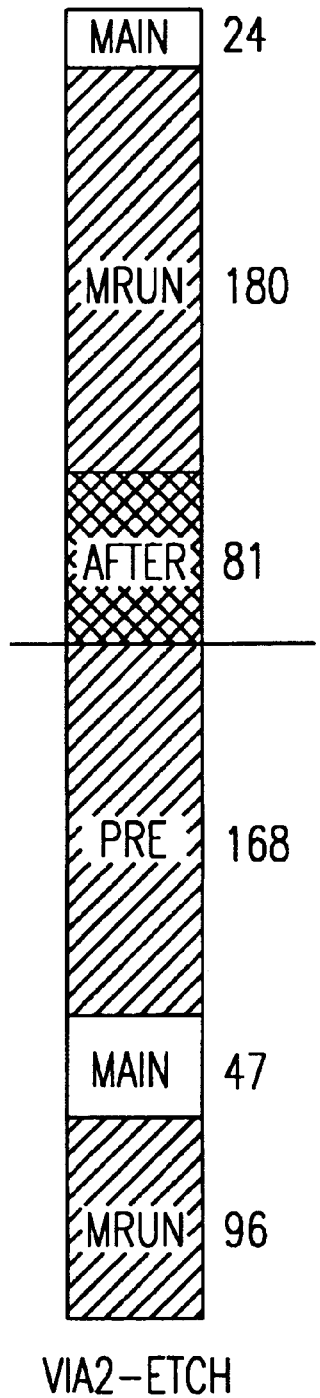
FIG.2 (Requested stage)

VISUALIZING METHODS FOR DISPATCH AND DIAGNOSIS OF FINITE MACHINES FOR SEMICONDUCTOR'S MANUFACTURING

FIELD OF THE INVENTION

The present invention relates to a method of dispatching for the semiconductor's manufacturing machines, and more specifically, to a method of visualizing the working condition of the semiconductor's manufacturing machines.

BACKGROUND OF THE INVENTION

In the semiconductor's manufacturing, hundreds of processing steps are needed for a semiconductor device. A product travels through different types of stages in a processing line, and a product has different processing time in every stage. For example, diffusion stage and implanting stage have long processing time (4–12 hours). The long-time stages are the bottlenecks of the processing line in a FAB. Also, a specified amount of wafers are put into the processing line everyday, but the processing speed of these wafers will be slow down in these long-time stages. When the tool's capacities of the processing line is reduced, the throughput of the processing line is reduced, too. The above condition reduces the efficiency of the machines in the FAB and increases the cost of the production in the semiconductor manufacturing. Thus, the goal to perform continuous production is important, and performing the dispatching is a great challenge in order to make sure the stability of the throughput of the processing line.

To make sure the production running continuously within finite tools, controlling the number of wafer-in-process (WIP) and the number of wafers to be put in the processing is important. In the prior art, using the key-stage report (KSR) of a processing line is a usual method to understand the working condition of the machines in the processing line. In the KSR, several parameters of the processing line are recorded. These parameters include the quantities of wafers which are in the preprocess of a stage, in the process of a stage and at the end of a stage.

TABLE 1:

| STAGE_ID | WIP | OUT | PRE | MAIN | MRUN | AFTER | TURN RATIO |
|---|---|---|---|---|---|---|---|
| WAF-START | 312 | 528 | 0 | 240 | 72 | 0 | 1.7 |
| SIN-1-PHO | 48 | 0 | 0 | 48 | 0 | 0 | 0 |
| WELL-OX | 0 | 14 | 0 | 0 | 0 | 0 | 0 |
| WELL-PHO | 444 | 252 | 0 | 348 | 96 | 0 | 0.6 |
| WELL-ETCH | 0 | 0 | 0 | 0 | 0 | 0 | 0 |
| N-WL-2-IMP | 270 | 522 | 0 | 174 | 0 | 96 | 1.9 |
| PWELL-PHO | 248 | 372 | 0 | 104 | 144 | 0 | 1.5 |
| P-WL-2-IMP | 210 | 720 | 0 | 114 | 48 | 48 | 3.4 |
| WELL-DRIV | 2281 | 736 | 1116 | 48 | 1116 | 1 | 0.3 |

As be shown in TABLE 1, a part of key-stage report is shown in this table. The sequence of the processes in this report is according to the production flow of a product in a FAB. For example, the third stage to the fifth stage of TABLE 1 are the formation of a well region. The stages are the oxide deposition of the well region, the lithography of the well region and the etching of the well region. These stages form a process chain. According to the report, supervisors of the production line can realize the working condition of the production line. In the following description, the datas of the report are explained. 'OUT' in this report means the counts of the wafers of which are from this stage to the next stage. 'MAIN' means the counts of wafers which are waiting for tools. 'MRUN' means the counts of wafers, which are processed by the tools in this stage. 'PRE' means the counts of wafers, which need preprocess for this stage, such as hot plate, B Clean etc. 'After' is the wafer at the end of this stage, such as the inspecting process. Supervisors realizes one stage in the process flow, for example, a lithography stage, by checking the quantities of the stage. As result of the invariable quality of the same type of equipments in a FAB, the equipments must have good allocation to every stages to make sure of the normality of the processing line.

One characteristic of the semiconductor's manufacturing in a processing line is the operational flows, which are repeated by tool (tool group) or area. Based on this fact, supervisor who takes care of some areas and tools must keep on watching the KSR. For example, in Table 2, the supervisor in the photo area must arrange the tools in photo stage well-etching process (WELL-ETCH), well high-energy implantation process (H-WL-2-IMP), P-type well implantation process (P-WL-2-IMP), second nitiride oxide etching process (SIN-2-OXET), second nitride etching process (SIN-2-ETCH) and P-type field region implantation process (P_FLD_IMP). The relationship of these stages is as below.

TABLE 2

| Supplied Stage | Reguested stage | |
|---|---|---|
| WELL-PHO | WELL-ETCH | H-WL-2-IMP |
| PWELL-PHO | P-WL-2-IMP | |
| SIN-2-PHO | SIN2-OXET | SIN-2-ETCH |
| P_FLD_PHO | P_FLD_IMP | |

In TABLE 2, the relationship between the supplied stages and the requested stages has many different types. After products have been through the process of the supplied stage, the products of the supplied stages then move to the requested stages. For example, the products after some photolithography's process can be moved to etching stages or implanting stages, the products after other photolithography's process could only be moved to implanting stages. The allocation of the photolithography's tools in a processing line can be changed. In other words, the requested stages have many different stages and the supplied stages have many different stages, too. Besides, the supervisors of a processing line must decide the allocation of the equipments in the supplied stage and solve the bottleneck problem of the processing line.

Supervisors read the KSR of the processing line in order to realize the working condition of the stages in the processing line and then decide the dispatching of the tools in the processing line. Currently, stage number of the photolithography in a production's flow is about twenty to thirty. The total number of the parameters in the production's flow is about two hundreds to three hundreds. The length of the report is between five to seven pages and the datas of the report is a fifth multiple of the datas of the TABLE 1. Controlling the status of photolithography's tools is a difficult job for the supervisors of the tools. Arranging the tool's capacity of the photo area to provide sufficient supply for every requested stage is a very important topic. However, the supervisor of the photo area can not make decision easily to perform dispatching for the finite tool's capacities from KSR or other report. In other words, the supervisors can not make a good dispatch for lack of powerful tools.

SUMMARY OF THE INVENTION

A visualizing method for the working condition of the semiconductor's manufacturing machines is disclosed in the present invention. The method is described in the following description. Firstly, the data of stages in a processing line are collected from the key-stage report of the processing line. The datas are "MAIN", "MRUN", "AFTER" and "PRE". Specified stage-pairs in the processing line are determined. These pairs comprise photolithography and etching, photolithography and implanting etc. The data of each stage-pair is sequentially arranged and is put into a bar chart. One pair has a supplied stage and a requested stage. From the bar chart, supervisors of the processing line can understand the working condition and the priority of every stage. Thus, the supervisors can decide the allocation of the tools in the processing line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 illustrates the graphics via 2 processes, which include photolithography and etching;

DETAILED DESCRIPTION OF THE PREFERRED EMBODIMENT

The invention proposes efficiency of visualization's tools and helps supervisors to perform local dispatching and diagnosis. The present invention will be described with the preferred embodiments in the following detailed descriptions.

Figure 1A:
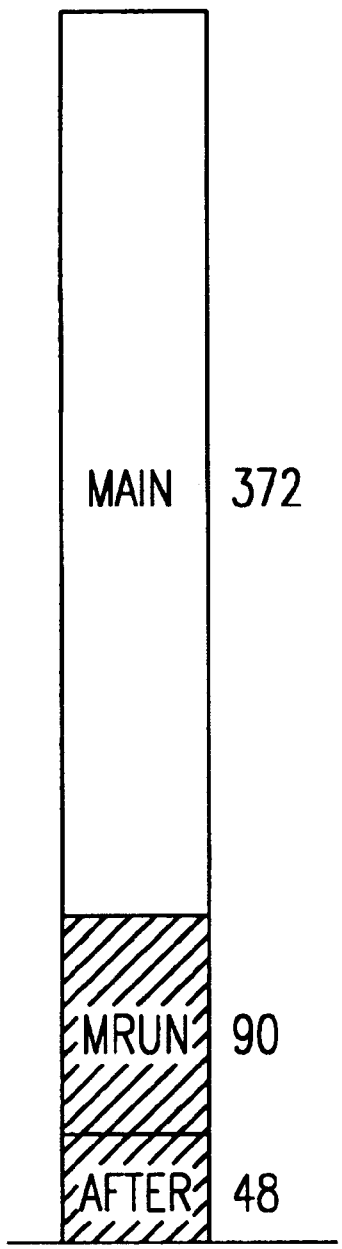
FIG. 1A illustrates the graphics of a supplied stage in a processing line.
Figure 1B:
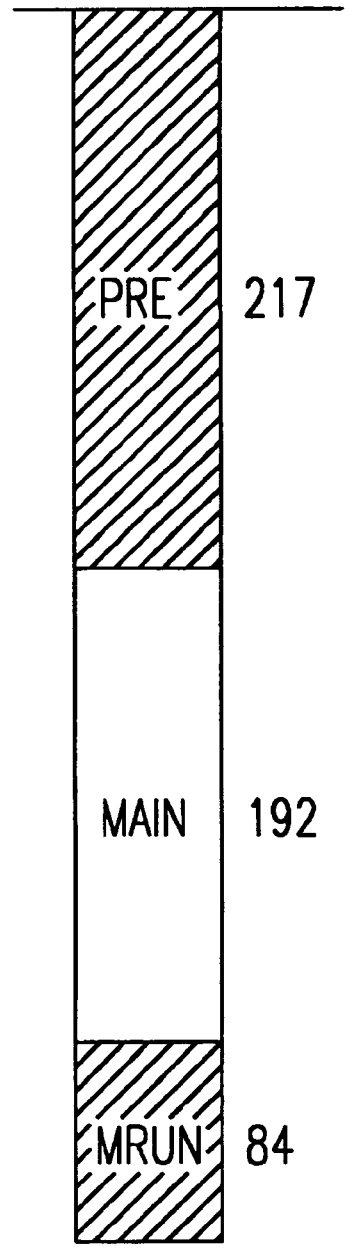
FIG. 1B illustrates the graphics of a requested stage in a processing line.

Referring to FIG. 1A and FIG. 1B, these two drawings show the visual presentations of different stages. The present invention uses graphics to show the status of PRE, MAIN, MRUN and AFTER of the stages in a processing line. The data of the processing line is put into a bar chart. By taking advantage of the bar chart, the wafer's quantity of each status can be easily read.

The length of 'MAIN' bar means an quantity of wafer-in-process (WIP) which is waiting for processing in a stage. Based on experience or some analysis, the WIP bar can be a standard level. Lower 'MAIN' bar means that the WIP become low quantity. The tools of this stage will be idle after the WIP is close to zero. High 'MAIN' bar means that many wafers are stored in the stage, the waiting time of the wafers in the stage is lengthy and the production amount of the processing line is reduced.

The length of 'MRUN' bar means the WIP's quantity processing by tools in this stage. Normally, this quantity is large; the output of this stage is large, too. It means that many tools are performed on the wafers of the stage now. Since the number of tools in one fab is finite, it is a limited resource. Some tools are focused on the WIP in this stage, some available tools are reduced for processing WIP in the other stages. This has become a dispatching problem.

The length of 'AFTER' bar means the quantity of the wafers, which is processing at the end of this stage, such as the inspection process. Usually, it is the WIP of an end production tool in this stage. Processing this WIP means that the wafers will become the output of this stage. The length of 'PRE' bar means that wafers need pre-process in this stage, such as Hot plate, B clean and etc.

Referring to FIG. 1A again, the figure is the visual presentation of a supplied stage in a processing line. The supplied stage is SIN-2-PHO process. The supplied stage includes three steps, 'MAIN', 'MRUN' and 'AFTER'. Referring to FIG. 1B again, this figure is the visual presentation of a requested stage in a processing line. The requested stage is POLY2-ETCH, which includes three processing steps. These steps are 'PRE', 'MAIN' and 'MRUN'.

Referring to FIG. 2, the visual representation of the figure shows the relationship between the supplied stage and the requested stage. Supervisors check whether the requested stage (lower bar below the horizontal line) has sufficient supply and whether the supplied stage (upper stage above the horizontal line) having the desired loading has sufficient amount of "PRE" and "MAIN." From FIG.2, the summation length of "PRE" and "MAIN" of the lower bar can find out the quantity easily for this issue. In the viewpoint of the supplied stage, how to achieve the goal to satisfy this demand is to keep the length of "MRUN" and "AFTER" of the requested stage. The corresponding tools should process specific wafers in the upper stage and the supervisors of the tools keep watching whether WIP (the length of "MAIN" of upper bar itself) is enough to ensure this demand.

Figure 3A:
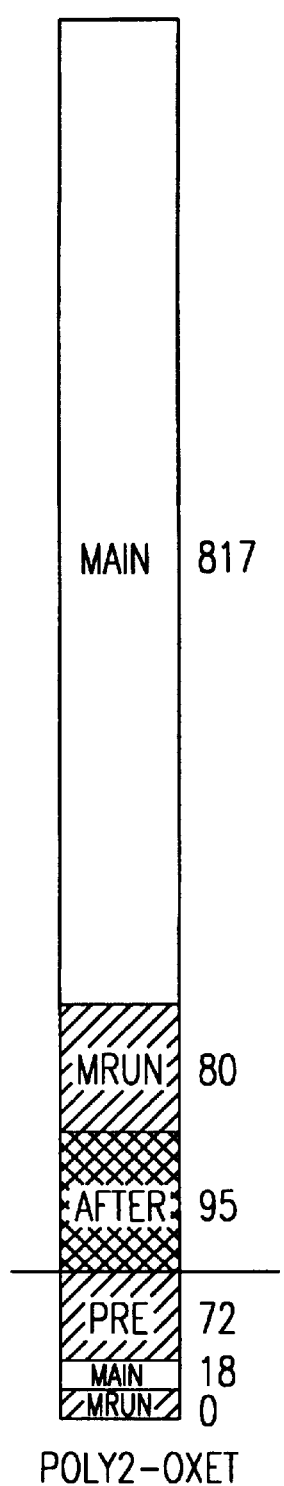
FIG. 3A illustrates the dispatching condition of a second polysilicon photolithography stage and a second polysilicon oxide etching stage.
Figure 3B:
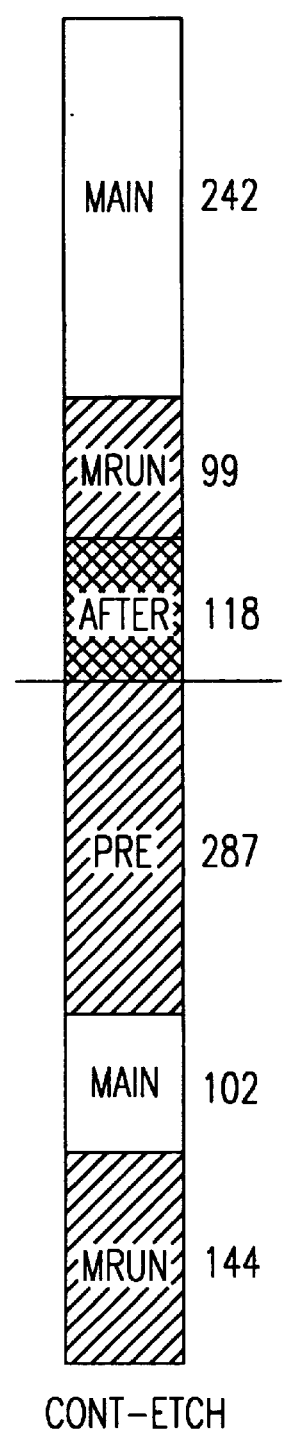
FIG. 3B illustrates the dispatching condition of a contact photolithography stage and a contact etching stage.
Figure 3C:
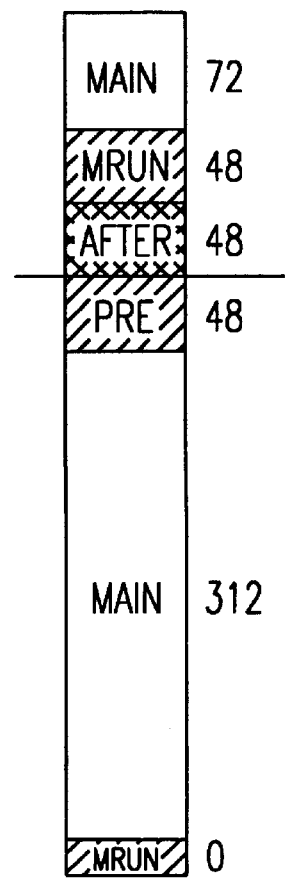
FIG. 3C illustrates the dispatching conditions of a third polysilicon photolithography stage and a third polysilicon etching stage.

Referring to FIGS. 3A to 3C, these drawings show the three examples that are discussed in the following descriptions. Also, there are informations of dispatching and diagnosis about the semiconductor machines in the drawings.

Referring to FIG. 3A, this example describes that the supplied stage (POLY-2-PHO) can not provide enough output for the requested stage (POLY2-OXET). The supervisors of photo area should arrange tools and increase the quantities of the wafers of "MAIN" and "AFTER" in the upper stage, and push the bar of the upper stage down to the under stage.

Referring to FIG. 3B, this example describes the supplied stage (CONT-PHO) which produces enough output for the requested stage (CONT-ETCH) because CONT-ETCH has enough "PRE" and "MAIN". The upper stage also keeps enough WIP ("MAIN") for its processing preparation.

Referring to FIG. 3C, this drawing shows that the supplied stage (POLY-3-PHO) produces the output more than enough for the next stage (POLY-3-ET). The upper bar has already been pushed down to the lower bar. Thus, the supervisor of photo area can arrange the tools of the supplied stage for other stages.

Figure 4:
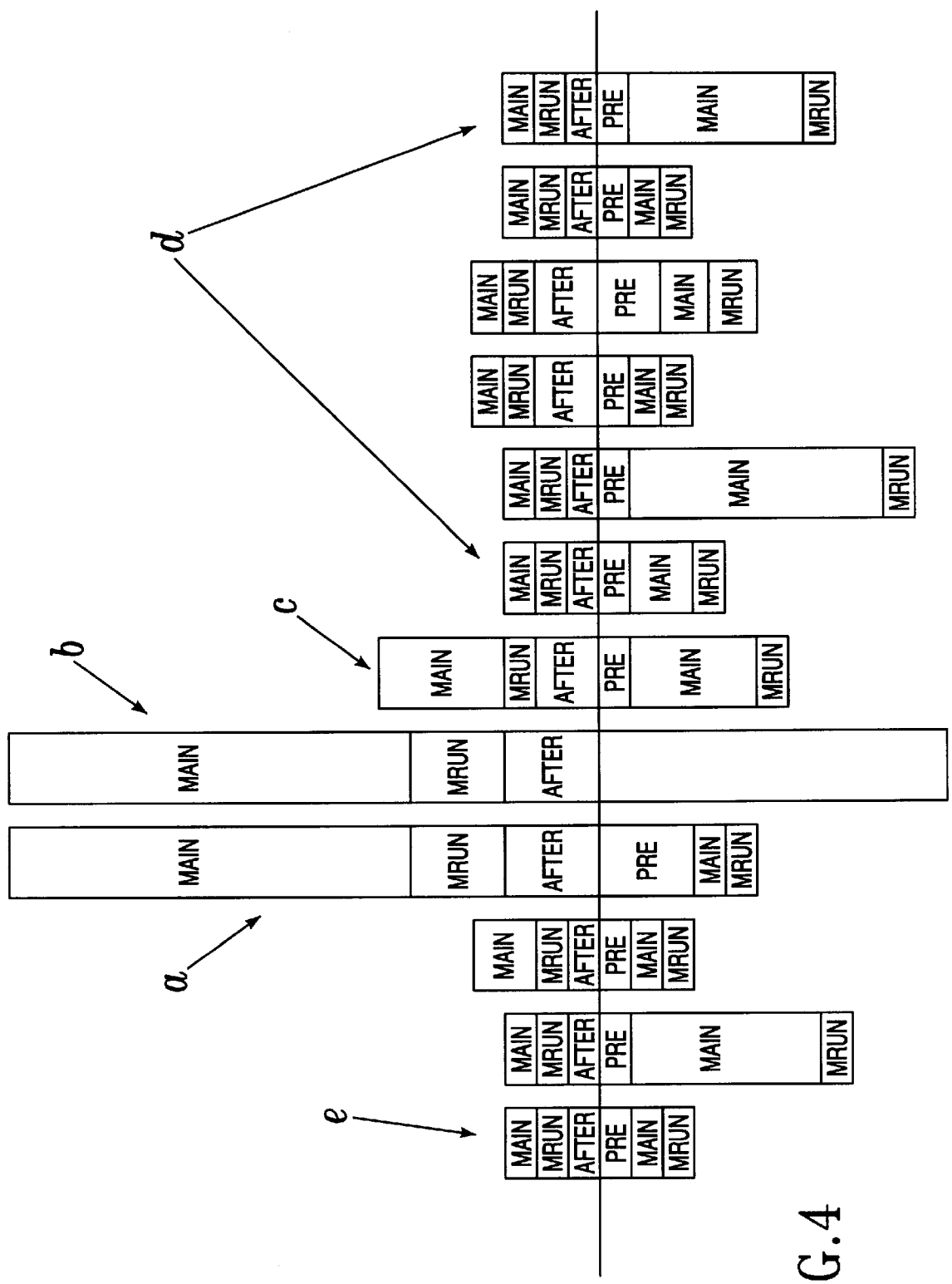
FIG. 4 illustrates the visual presentation of the pairs for the same type of tools in a processing line, exhibiting the working conditions of these stages.

Referring to FIG. 4, this drawing shows the visual presentation of the stage-pairs for the same type of tools in a processing line. In the processing line of a product, many processing steps are needed. Some processes are repeated, like to photolithography and etching. In FIG. 4 there are same type of stage-pairs in the processing line. In this drawing, four conditions are mentioned. These conditions and their dispatching priority are listed in TABLE 3. Each one of these cases has a dispatching priority. According to the priority of the stages, supervisors decide the allocation of the tools. The table also shows the priority of every case.

TABLE 3

| Case | WIP in a supplied stage | WIP in a requestor stage | Dispatching Priority of a request stage |
|---|---|---|---|
| a | High | Low | 1 |
| b | High | High | 2 |
| c | Medium | Medium | 3 |
| d | Low | High | 2 |
| E | Low | Low | 1 |

Based on the above discussion, the WIP bar chart and the up/down-stream relation approach are very efficient for quick and precise dispatching in semiconductor manufacturing. By using the visual presentation of the stages, it helps the supervisors to know the condition of the stages easily. Thus, the data of the key-stage report of the processing line are transformed to the visual presentation by using the described method. In addition to the comparision between requester stages and supplied stages to decide the dispatching priority of the supplied stage, two standard lines are set up on the bar chart of the supplied stage and the requester stage to distinguish the quantity of wafer-in-process in the stages and decide the dispatching priority of the supplied stage. When the bar chart of a stage is above (below) the standard line, the wafer-in-process quantity of the stage is high (low). Supervisors can realize the working condition of the stages in a processing line by using the quantitive method and effectively decide the dispatching priority of the stages without relying on their experience.

Referring to FIG. 4 again, several stages are shown in this drawing and are arranged according to the sequence of a processing line. The bar charts of supplied stages are above the horizontal line in this drawing and the bar charts of requested stages are below the horizontal line. The length of the bar charts is the quantity of wafer-in-process and the unit of the bar chart is the number of wafer-in-process. In addition, the unit of the bar chart could be depended on the processing time of stages. For example, two stages are in a processing line and have different processing time for a product. The processing time of the first stage is one hour and the second stage needs three hour to perform a process. If the two stages have same wafer-in-process quantity, the bar length of the second stage is a third multiple to the bar length of the first stage. The processing of the stages is shown in the bar chart. Supervisors know the load of the stages by using the bar chart with a time unit and precisely decide the dispatching priority of the supplied stages in a processing line.

As is understood by a person skilled in the art, the foregoing preferred embodiment of the present invention are illustrated of the present invention rather than limiting of the present invention. For example, the stage-pair is not only photolithography and etching, but also photolithography and implanting. Other stages in a processing line form another type of stage pairs and the present invention can be applied to these stage pairs.

While the preferred embodiment of the invention has been illustrated and described, it will be appreciated that various changes can be made therein without departing from the spirit and scope of the invention.

What is claimed is:

1. A visualizing method of dispatching and diagnosis of finite machines for facilitating tool allocation while manufacturing semiconductor wafers, said method comprising the steps of:

forming an upper strip of a bar chart, representing quantities of a plurality of semiconductor wafers in a supplied stage of manufacture;

forming an under strip of a bar chart, representing quantities of said plurality of semiconductor wafers in a requested stage of manufacture;

visually examining said upper strip and said under strip for determining dispatching priorities for tools in said supplied stage and said requested stage; and adjusting tool allocation based on current tool capacities for said supplied stage and said requested stage in accordance with said dispatching priorities, thereby optimizing said tool allocation.

2. The method of claim 1, wherein said upper strip comprises:

a main region, representing quantities of said plurality of semiconductor wafers which are waiting for processing in said supplied stage;

a main-run region, representing quantities of said plurality of semiconductor wafers which are processed in said supplied stage; and an after-process region, representing quantities of said plurality of semiconductor wafers which are at the end of said supplied stage.

3. The method of claim 1, wherein said under strip comprises:

a preprocessing region, representing quantities of said plurality of semiconductor wafers which are pre-processed in said requested stage;

a main region, representing quantities of said plurality of semiconductor wafers which are waiting for processing in said requested stage; and a main-run region, representing quantities of said plurality of semiconductor wafers which are under processing in said requested stage.

4. The method of claim 1, wherein the length of said upper strip and said under strip depend on the processing time of said stages and the unit of said upper and under strips is measured by hour, when said processing time of one of said stages is N hours, the strip-length of said one of said stages is multiplied by N.

5. The method of claim 1, wherein said tool capacities for said supplied and requested stages are determined by setting up a standard line on said upper and under strips, when said strips exceed said standard line, the quantities of said semiconductor wafers in said stage being indicated surplus, when said strips are under said standard line, the quantities of said semiconductor wafers in said stage being indicated insufficient.

6. The method of claim 5, when said upper is above said standard line and said under strip is below said standard line, said dispatching priority is designated as the first priority.

7. The method of claim 5, when said upper strip is above said standard line and said under strip is above said standard line, said dispatching priority is designated as the second priority.

8. The method of claim 5, when said upper strip has a length equal to said standard line and said under strip has a length equal to said standard line, said dispatching priority is designated as the second priority.

9. The method of claim 5, when said upper strip is below said standard line and said under strip is above said standard line, said dispatching priority is designated as the third priority.

10. The method of claim 5, when said upper strip is below said standard line and said under strip is below said standard line, said dispatching priority is designated as the third priority.

11. A method for visualizing a working condition of stages in semiconductor manufacturing, comprising the steps of:

determining quantities of semiconductor wafers in a supplied stage, comprising the quantity of the wafers which are waiting for processing in said supplied stage, the wafers which are processed in said supplied stage and the wafers which are at the end of the process in said supplied stage, then putting said quantities of semiconductor wafer in said supplied stage sequentially into an upper strip;

determining quantities of semiconductor wafers in a requested stage, comprising the quantity of the wafers which are pre-processed in said requested stage, the wafers which are waiting for processing in said requested stage and the wafers which are under processing in said requested stage, then putting the quantities of semiconductor in said requested stage into an under sequentially;

linking said upper strip to said under strip;

forming a bar chart for visually representing said quantities of semiconductor wafers in said stages by listing a plurality of said linked upper and under strips according to a manufacturing sequence;

setting up two standard lines on said upper strip and said under strip for evaluating said quantities of semiconductor in said supplied stages and said requester stages; and deciding dispatching priorities for said supplied stage and said requested stage.

12. The method of claim 11, wherein the lengths of said upper strip and said under strip depend on the processing time of said stages and the unit of said upper and under strips is measured by hour, when said processing time of one of said stages is N hours, the strip-length of said one of said stages is multiplied by N.

13. The method of claim 11, when said upper strip is above said standard line and said under strip is below said standard line, said dispatching priority is designated as the first priority.

14. The method of claim 11, when said upper strip is above said standard line and said under strip is above said standard line, said dispatching priority is designated as the second priority.

15. The method of claim 11, when said upper strip has a length equal to said standard line and said under strip has a length equal to said standard line, said dispatching priority is designated as the second priority.

16. The method of claim 11, when said upper strip is below said standard line and said under strip is above said standard line, said dispatching priority is designated as the third priority.

17. The method of claim 11, when said upper strip is below said standard line and said under strip is below said standard line, said dispatching priority is designated as the third priority.

* * * * *

UNITED STATES PATENT AND TRADEMARK OFFICE
CERTIFICATE OF CORRECTION

PATENT NO. : 6,230,068 B1
DATED : May 8, 2001
INVENTOR(S) : H.-C. Wu et al

It is certified that error appears in the above-identified patent and that said Letters Patent is hereby corrected as shown below:

Column 7,
Line 7, "upper is" should read -- upper strip is --

Column 8,
Line 1, "semiconductor" should read -- semiconductor wafers --
Line 2, "under sequentially;" should read -- under strip sequentially; --
Line 10, "ductor" should read -- ductor wafers --
Line 10, "requester" should read -- requested --

Signed and Sealed this

Fourth Day of December, 2001

Attest:

NICHOLAS P. GODICI
*Attesting Officer*  *Acting Director of the United States Patent and Trademark Office*